United States Patent
Kwa

(10) Patent No.: US 9,581,614 B2
(45) Date of Patent: *Feb. 28, 2017

(54) HIGH-OUTPUT MEMS ACCELEROMETER

(71) Applicant: Meggitt (Orange County), Inc., Irvine, CA (US)

(72) Inventor: Tom Kwa, San Jose, CA (US)

(73) Assignee: MEGGIT (ORANGE COUNTY), INC., Irvine, CA (US)

( * ) Notice: Subject to any disclaimer, the term of this patent is extended or adjusted under 35 U.S.C. 154(b) by 178 days.

This patent is subject to a terminal disclaimer.

(21) Appl. No.: 14/293,992

(22) Filed: Jun. 2, 2014

(65) Prior Publication Data

US 2015/0346235 A1    Dec. 3, 2015

(51) Int. Cl.

| | |
|---|---|
| *G01P 15/12* | (2006.01) |
| *G01P 15/09* | (2006.01) |
| *B81B 3/00* | (2006.01) |
| G01P 15/08 | (2006.01) |

(52) U.S. Cl.
CPC .......... *G01P 15/123* (2013.01); *B81B 3/0021* (2013.01); *G01P 15/09* (2013.01); *G01P 15/12* (2013.01); *B81B 2201/0235* (2013.01); *B81B 2203/0109* (2013.01); *G01P 2015/0831* (2013.01)

(58) Field of Classification Search
CPC ...... G01P 15/123; G01P 15/122; G01P 15/12; G01P 15/09; G01P 15/18; G01P 15/08; G01P 15/0802
USPC .............. 73/514.33, 514.34, 514.36, 514.38
See application file for complete search history.

(56) References Cited

U.S. PATENT DOCUMENTS

| | | |
|---|---|---|
| 4,737,473 A | 4/1988 | Wilner |
| 4,793,194 A | 12/1988 | Wilner |
| 5,233,213 A | 8/1993 | Marek |
| 5,261,277 A | 11/1993 | Thomas et al. |
| 5,456,110 A | 10/1995 | Hulsing, II |
| 5,905,203 A | 5/1999 | Flach et al. |
| 6,230,566 B1 | 5/2001 | Lee et al. |
| 7,360,422 B2 * | 4/2008 | Madni .................... G01C 19/56 73/504.12 |

(Continued)

*Primary Examiner* — Helen Kwok
(74) *Attorney, Agent, or Firm* — Hackler Daghighian Martino & Novak

(57) ABSTRACT

A MEMS acceleration sensor is provided. In one embodiment, the MEMS acceleration sensor comprises: a frame; a first proofmass located within the frame, the first proofmass including a left side, right side, top, and bottom; an axis running from the left side to the right side at about a median point between the top and bottom; a first flexure running along the axis and coupling the left side to the frame; a second flexure running along the axis and coupling the right side to the frame; a first channel that extends from the bottom up past the axis to a first channel end; a second channel that extends from the top down past the axis to a second channel end; a second proofmass located within the first channel and coupled to the first proofmass via a first hinge and a first gauge at the first channel end and coupled to the frame at the bottom via a second hinge and a second gauge; and a third proofmass located within the second channel and coupled to the first proofmass via a third hinge and a third gauge at the second channel end and coupled to the frame at the top via a fourth hinge and a fourth gauge.

20 Claims, 9 Drawing Sheets

(56) References Cited

U.S. PATENT DOCUMENTS

| | | |
|---|---|---|
| 7,743,661 B2 | 6/2010 | Berthold et al. |
| 7,987,716 B2 * | 8/2011 | Wilner ................ G01P 15/0888 |
| | | 73/514.33 |
| 9,146,254 B2 * | 9/2015 | Yoshida ................ B81B 3/0021 |
| 2002/0184949 A1 | 12/2002 | Gianchandani et al. |
| 2004/0200281 A1 | 10/2004 | Kenny et al. |
| 2005/0091843 A1 | 5/2005 | Yu |
| 2005/0166677 A1 | 8/2005 | Nasiri et al. |
| 2010/0300205 A1 * | 12/2010 | Kazama .................. G01P 1/023 |
| | | 73/514.33 |
| 2011/0006380 A1 * | 1/2011 | Hattori ................ G01P 15/0802 |
| | | 257/415 |
| 2012/0060605 A1 | 3/2012 | Wu et al. |
| 2012/0132003 A1 | 5/2012 | Comi et al. |
| 2013/0247667 A1 | 9/2013 | Malvern |
| 2014/0041452 A1 | 2/2014 | Westberg et al. |
| 2015/0331010 A1 * | 11/2015 | Hamamura ........... G01P 15/123 |
| | | 73/514.33 |
| 2016/0018435 A1 * | 1/2016 | Kwa ....................... G01P 15/09 |
| | | 73/514.34 |

* cited by examiner

HIGH-OUTPUT MEMS ACCELEROMETER

FIELD

The present patent document relates to micro-electromechanical accelerometers. More particularly, the present patent document relates to high-output micro-electro-mechanical accelerometers with freed gauges.

BACKGROUND

An accelerometer is a transducer that converts acceleration forces into electronic signals. Accelerometers are applied and used in a variety of devices. For example, accelerometers are often included in automobile systems for air-bag deployment and roll-over detection. Accelerometers are also used in computer devices, such as for motion-based sensing (e.g. for drop detection) and motion-based control (e.g. in gaming).

A micro-electro-mechanical system (MEMS) accelerometer typically includes, among other things, a proofmass and one or more sensors for sensing movement or changes in position of the proofmass that are induced by external accelerations. A MEMS accelerometer can be configured to sense acceleration along one or more axes. Typically, the proofmass is configured in a predetermined device plane, and the axes of sensitivity are referenced relative to this device plane. For example, accelerations sensed along an axis or axes parallel to the device plane are usually referred to as X- or Y-axis accelerations, and accelerations sensed along an axis perpendicular to the device plane are usually referred to as Z-axis accelerations. A single-axis accelerometer might be configured to detect only X- or Y-axis accelerations or only Z-axis accelerations. A two-axis accelerometer might be configured to detect X- and Y-axis accelerations or might be configured to detect X- and Z-axis accelerations. A three-axis accelerometer might be configured to detect all three of X-, Y-, and Z-axis accelerations.

In the MEMS field, using a pressure- or force-sensitive element, such as a cantilever, in conjunction with a strain-sensing element for measuring acceleration, force, or pressure, is known in the art. Accelerations on the strain-sensing element along the relevant axis will put that element into tension or compression, thereby changing the element's cross-sectional area and the resistance to the flow of electrical current in proportion to the acceleration. The change in resistance is measured using techniques such as a Wheatstone bridge to determine the amount of acceleration.

Prior attempts to achieve high sensitivity in acceleration sensors have been plagued by susceptibility to cross-axis, i.e. out-of-plane, accelerations. Thus, there is a need for a high-output MEMS accelerometer that is sensitive in the plane it is designed to measure while being insensitive to out-of-plane accelerations.

SUMMARY OF THE EMBODIMENTS

In view of the foregoing, an object according to one aspect of the present patent document is to provide a MEMS device for detecting acceleration. Preferably the methods and apparatuses address, or at least ameliorate, one or more of the problems described above. To this end, a MEMS acceleration sensor is provided. In one embodiment, the MEMS acceleration sensor comprises: a frame; a first proofmass located within the frame, the first proofmass including a left side, right side, top, and bottom; an axis running from the left side to the right side at about a median point between the top and bottom; a first flexure running along the axis and coupling the left side to the frame; a second flexure running along the axis and coupling the right side to the frame; a first channel that extends from the bottom up past the axis to a first channel end; a second channel that extends from the top down past the axis to a second channel end; a second proofmass located within the first channel and coupled to the first proofmass via a first hinge and a first gauge at the first channel end and coupled to the frame at the bottom via a second hinge and a second gauge; and a third proofmass located within the second channel and coupled to the first proofmass via a third hinge and a third gauge at the second channel end and coupled to the frame at the top via a fourth hinge and a fourth gauge.

In preferred embodiments of the MEMS acceleration sensor, the first proofmass rotates relative to the frame about the axis. In yet other embodiments, the proofmass may teeter-totter or seesaw about the axis. In preferred embodiments, the gauges are made from a piezoresistive material. In some embodiments, rotation of the first proofmass about the axis causes a piezoresistive effect in at least one of the gauges.

In some embodiments of the MEMS acceleration sensor, the first proofmass is S-shaped. In some embodiments, of the MEMS acceleration sensor, the second proofmass and third proofmass are rectangular cuboids. However, in other embodiments, the proofmasses may be any shape.

In yet other embodiments of the MEMS acceleration sensor, the frame is a stationary rim. In preferred embodiments, the frame may have a length of 1.6 millimeters or less and a width of 1.6 millimeters or less.

In a preferred embodiment, all the hinges are located above a centerline of a thickness of the first proofmass. The thickness of the proofmass being defined by a distance between a top surface and a bottom surface of the proofmass.

In another aspect of the present patent document, a MEMS acceleration sensor is provided. The MEMS acceleration sensor comprises: a frame; an S-shaped proofmass located within the frame; wherein the S-shaped proofmass includes a top horizontal piece, a center horizontal piece, a bottom horizontal piece, a left side piece that connects the top horizontal piece to the center horizontal piece, and a right side piece that connects the center horizontal piece to the bottom horizontal piece; wherein the S-shaped proofmass forms a first channel that exists between the top horizontal piece and the center horizontal piece and extends from the frame to the left side piece; and wherein the S-shaped proofmass forms a second channel that exists between the center horizontal piece and the lower horizontal piece and extends from the frame to the right side piece; a first flexure coupling the top horizontal piece to the frame; a second flexure coupling the bottom horizontal piece to the frame; a first rectangular cuboid proofmass located within the first channel and coupled to the left side piece of the S-shaped proofmass via a first hinge and a first gauge and coupled to the frame via a second hinge and a second gauge at an opposite end of the first rectangular cuboid proofmass from the first hinge; a second rectangular cuboid proofmass located within the second channel and coupled to the right side piece of the S-shaped proofmass via a third hinge and a third gauge and coupled to the frame via a fourth hinge and a fourth gauge at an opposite end of the second rectangular cuboid proofmass from the third hinge.

In a preferred embodiment, each gauge is located above a hinge and coupled to the same elements of the proofmasses and the frame as the respective hinge it lies above.

In some embodiments, the S-shaped proofmass rotates relative to the frame about an axis running from a top side of the frame to a bottom side of the frame at about a median point between a left side of the frame and a right side of the frame. In such embodiments, the first gauge, second gauge, third gauge, and fourth gauge may be made of a piezoresistive material. In some embodiments, rotation of the S-shaped proofmass about the axis causes a piezoresistive effect in at least one of the first gauge, second gauge, third gauge, and fourth gauge.

In yet other embodiments, the frame is a stationary rim. In such embodiments, the frame may have a length of 1.6 millimeters or less and a width of 1.6 millimeters or less.

In another aspect of the present patent document, a MEMS acceleration sensor is provided. The MEMS acceleration sensor comprises: a frame; a proofmass located within the frame, the proofmass including at least three vertical blocks and at least two horizontal blocks coupling alternate vertical blocks to form a single proofmass, wherein the proofmass has a left side, right side, top, and bottom; a first flexure coupling the left side of the proofmass to the frame; a second flexure coupling the right side of the proofmass to the frame, wherein the first flexure and the second flexure define a pivot axis for the proofmass with respect to the frame; a first vertical channel that extends from a bottom of the frame up into the proofmass past the pivot axis between two vertical blocks to a first of the at least two horizontal blocks; a second vertical channel that extends from a top of the frame down into the proofmass past the pivot axis to a second of the at least two horizontal blocks; a first elongated proofmass located within the first vertical channel and coupled to the proofmass via a first hinge and coupled to the frame via a second hinge; and a second elongated proofmass located within the second vertical channel and coupled to the proofmass via a third hinge and coupled to the frame via a fourth hinge; and at least two gauges wherein the two gauges are located above any 2 of the 4 hinges and each gauge is coupled to the same elements as the respective hinge each gauge is located above.

In some embodiments, the gauges are made of a piezoresistive material. In such embodiments, rotation of the proofmass about the pivot axis causes a piezoresistive effect in at least one of the gauges.

In other embodiments, the first elongated proofmass and second elongated proofmass are rectangular cuboids.

As described more fully below, the apparatuses of the embodiments of the MEMS acceleration sensors help solve or at least ameliorate problems with prior accelerometers. Further aspects, objects, desirable features, and advantages of the apparatuses disclosed herein will be better understood from the detailed description and drawings that follow in which various embodiments are illustrated by way of example. It is to be expressly understood, however, that the drawings are for the purpose of illustration only and are not intended as a definition of the limits of the claimed embodiments.

DETAILED DESCRIPTION OF THE EMBODIMENTS

Figure 1A:
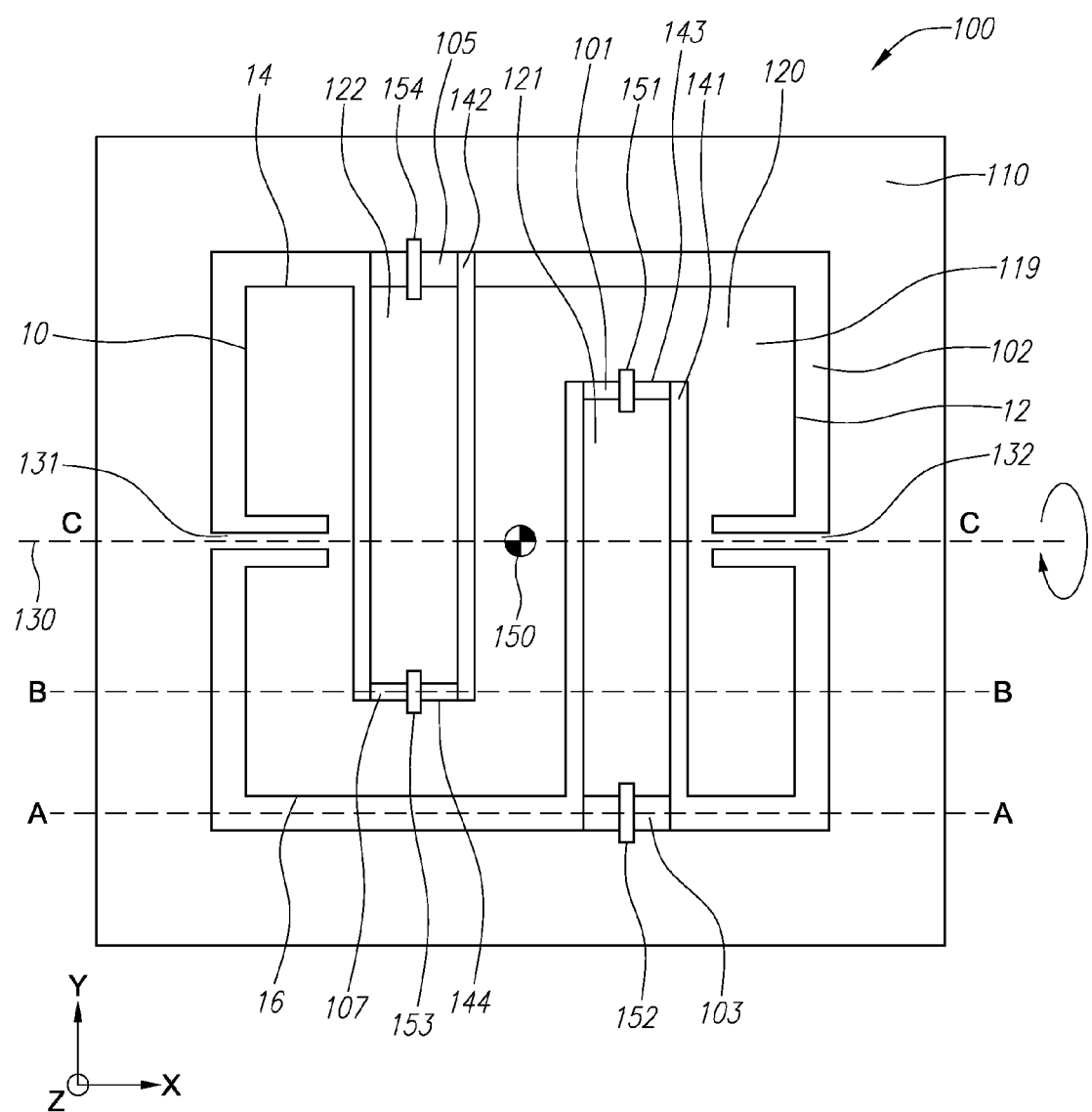
FIG. 1A illustrates a top view of one embodiment of a MEMS acceleration sensor.
Figure 1B:
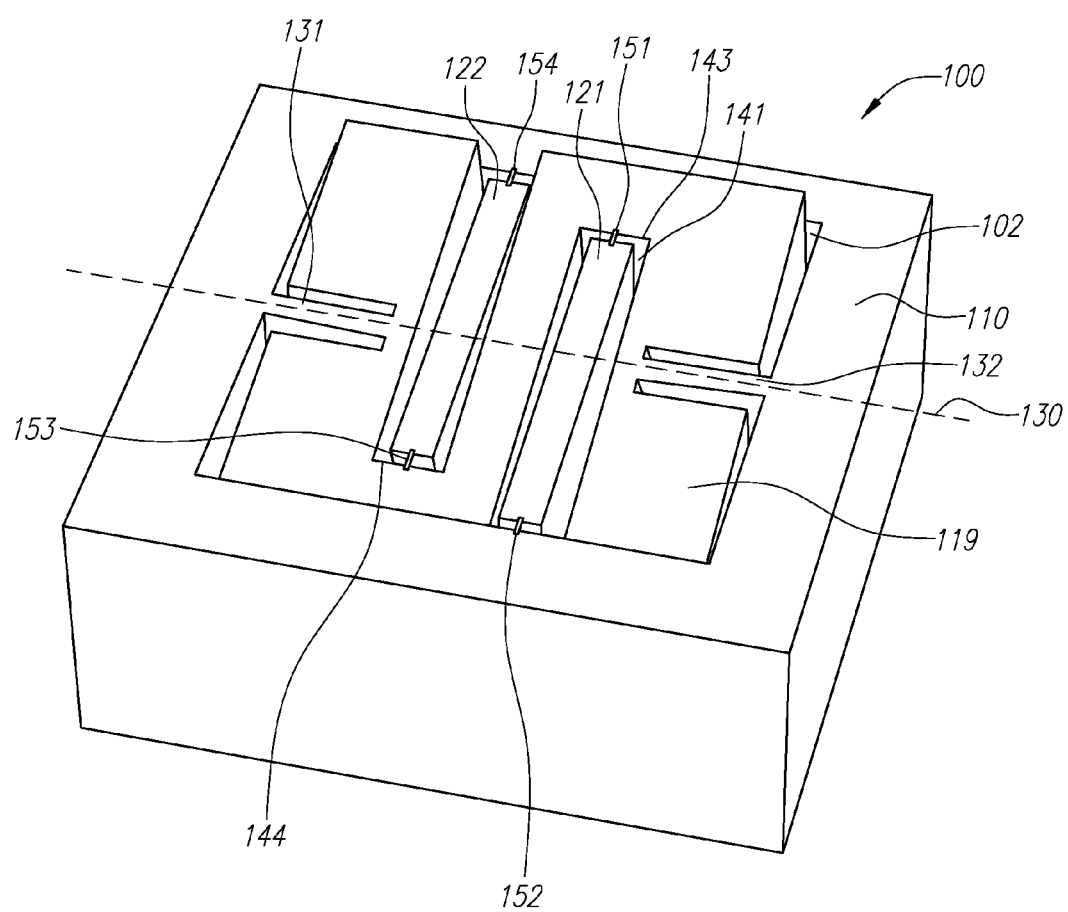
FIG. 1B illustrates an isometric view of the MEMS acceleration sensor of FIG. 1A.
Figure 1C:
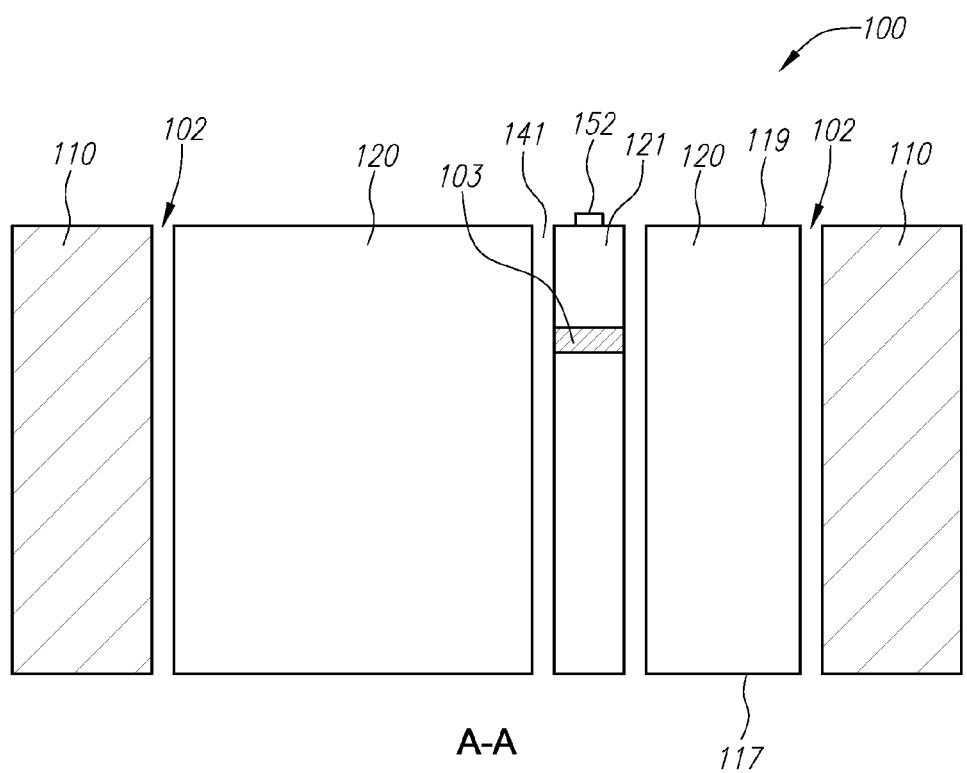
FIG. 1C illustrates a cross-sectional view A-A of the embodiment of a MEMS acceleration sensor shown in FIG. 1A.
Figure 1D:
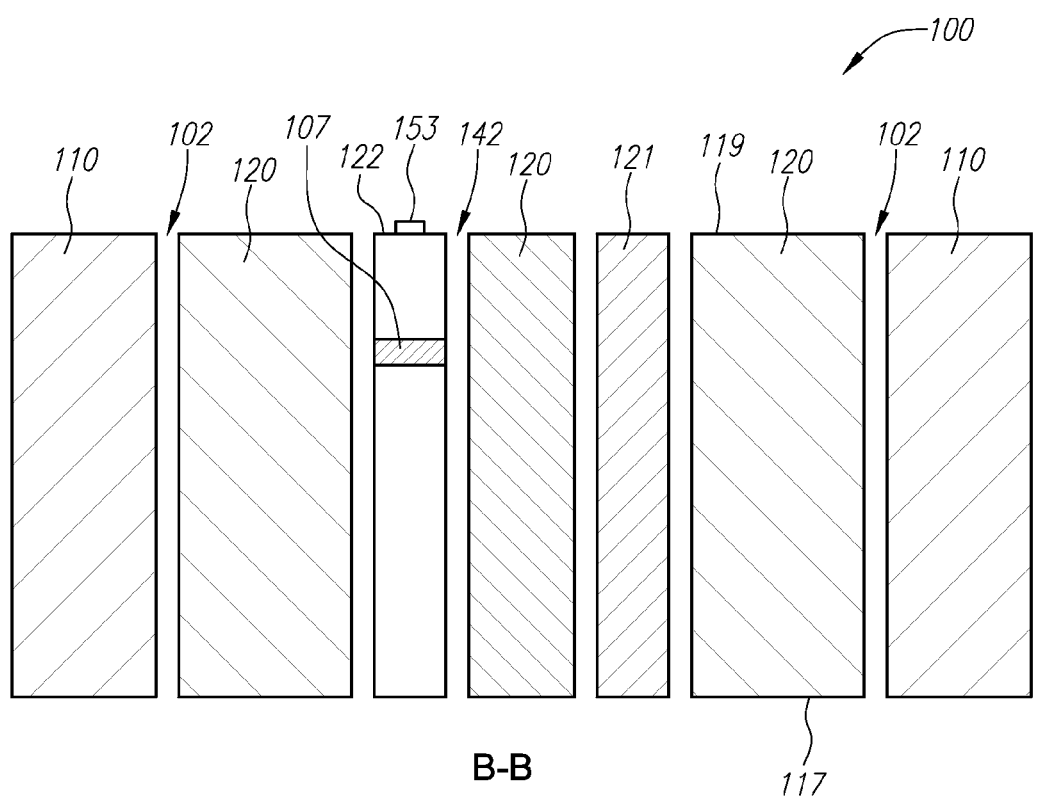
FIG. 1D illustrates a cross-sectional view B-B of the embodiment of a MEMS acceleration sensor shown in FIG. 1A.
Figure 1E:
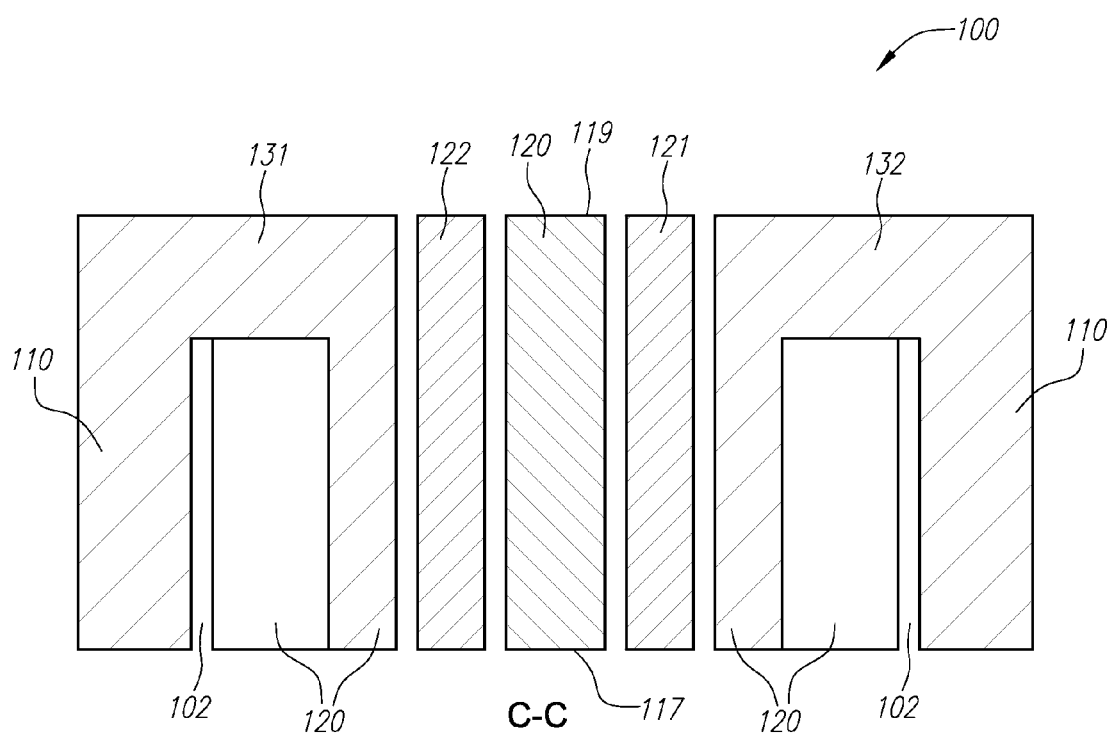
FIG. 1E illustrates a cross-sectional view C-C of the embodiment of a MEMS acceleration sensor shown in FIG. 1A.

FIG. 1A illustrates a top view, a view of the top surface 119, of a MEMS acceleration sensor 100. FIG. 1B illustrates an isometric view of the MEMS acceleration sensor in FIG. 1A. FIGS. 1C, 1D, and 1E illustrate different cross-sectional views A-A, B-B, and C-C of the embodiment of the MEMS acceleration sensor in FIGS. 1A and 1B.

In the embodiment of the MEMS acceleration sensor 100 shown in FIG. 1A-1E, the acceleration sensor 100 includes frame 110; proofmasses 120, 121, and 122; axis 130; flexures 131 and 132; channels 141 and 142; hinges 101, 103, 105 and 107, and gauges 151, 152, 153, and 154. Proofmass 120 has a left side 10, right side 12, top 14, and bottom 16, and is located within frame 110. In the embodiment shown in FIG. 1A, the flexures 131 and 132 define an axis of rotation 130 that runs from the left side 10 to the right side 12 of proofmass 120 at about a median point between the top 14 and bottom 16 of proofmass 120. As used herein, "about a median point" refers to a point that is approximately geometrically centered on the proofmass 120. In other embodiments, the axis of rotation 130 may deviate slightly from center and still be within the range "about a median point." For example, the axis of rotation 130 may be off center by 25% of the length of the proofmass 120 depending on the embodiment. In other embodiments, it may be off center by 15% or 5% of the length of the proofmass 120.

In a preferred embodiment, the axis of rotation 130 runs directly through the center of gravity 150 of the proofmass 120 such that an equal amount of mass resides on each side of the axis 130. However, in other embodiments, the axis 130 may be slightly off center from the center of gravity 150.

Flexure 131 runs parallel along the axis 130 and couples the left side 10 of proofmass 120 to frame 110, and flexure 132 similarly runs parallel along the axis 130 and couples the right side 12 of proofmass 120 to frame 110. Channel 141 extends from the bottom 16 of proofmass 120 up past axis 130 to a channel end 143, and channel 142 extends from the top 14 of proofmass 120 down past axis 130 to a channel end 144. Proofmass 121 is located within channel 141. Proofmass 121 is coupled to the proofmass 120 by hinge 101 and gauge 151 at channel end 143. Proofmass 121 is further coupled to the frame 110 at the opposite end from hinge 101 by hinge 103 and gauge 152. Proofmass 122 is located within channel 142, and is coupled to proofmass 120 via hinge 107 and gauge 153 at channel end 144. Proofmass 122 is further coupled to the frame 110 at the opposite end from hinge 107 via hinge 105 and gauge 154.

In the preferred embodiment, proofmasses 120, 121, and 122 are formed from the wafer layer of a silicon wafer. In a preferred embodiment, proofmasses 120, 121 and 122 are formed by etching away the material between the proofmasses and between the proofmasses and the frame 110 as shown in FIG. 1A. The removal of the material forms channels 141 and 142. In a preferred embodiment, during the etching process, hinges 101, 103, 105 and 107 are left in the spaces between the proofmasses, and the spaces between the proofmasses and the frame 110, as shown. As may be seen in cross sections A-A and B-B shown in FIGS. 1C and 1D, In a preferred embodiment, the hinges are formed above a centerline of a thickness of the proofmass 120. The centerline of the thickness of the proofmass 120 being defined by the halfway point between the top surface 119 and the bottom surface 117 of the proofmass 120. In a preferred embodiment, the hinges 101, 103, 105 and 107 are formed from etching both down from the top surface 119 and up from the bottom surface 117.

In a preferred embodiment, gauges 151, 152, 153 and 154 are formed from the device layer of a silicon wafer. In an even more preferred embodiment, gauges 151, 152, 153 and 154 are freed gauges. Free gauges are described in U.S. Pat. Nos. 4,498,229 and 4,737,473, which are herein incorporated by reference in their entirety.

In a preferred embodiment, an acceleration in the Y or −Y direction of FIG. 1A causes proofmass 120 to rotate relative to the frame 110 about axis 130. The rotation of proofmass 120 can occur in either a clockwise or a counter-clockwise direction. In some embodiments, the proofmass 120 may be thought of as being similar to a teeter-totter with the flexures 131 and 132 on each side of the proofmass forming the fulcrum. To this end, the motion of proofmass 120 may be described as a seesaw motion about axis 130.

MEMS acceleration sensor 100 is accordingly sensitive to accelerations in a single axis that rotate the proofmass 120 about axis 130, but is insensitive to cross-axis accelerations i.e., accelerations in the X or Z axis as shown in FIG. 1A.

In operation, when, for example, a negative acceleration is applied along the Y axis to MEMS acceleration sensor 100, proofmass 120 rotates about axis 130 as shown in FIG. 1B. The rotation of proofmass 120 causes gauges 151, 152 to be compressed and gauges 153, and 154 to stretch and come into tension. The compression and tension of the gauges causes a change in resistance within gauges 151, 152, 153, and 154 to the flow of electrical current, in proportion to the magnitude of the acceleration. In a preferred embodiment, gauges 151, 152, 153, and 154 are made of a piezoresistive material, and rotation of proofmass 120 about axis 130 causes a measurable piezoresistive effect in at least one of gauges 151, 152, 153, and 154.

In a preferred embodiment, such as the one shown in FIG. 1A, the channels 141 and 144 are rectangles and proofmasses 121 and 122 are rectangular cuboids. However, in other embodiments, channels 141 and 144 may be other shapes and/or proofmasses 121 and 122 may be of other shapes, such as cylinders, triangular prisms, trapezoidal prisms, or cubes.

In one embodiment, frame 110 is a stationary rim with a length of 1.6 millimeters or less and a width of 1.6 millimeters or less. Of course, embodiments of other sizes may be made without departing from the scope of the present patent document. Thus, in other embodiments, frame 110 may have a length and/or width greater than 1.6 millimeters. Also, in other embodiments, the frame may be rectangular such that the length and width may not be the same.

FIG. 1C illustrates a cross-sectional view of cross section A-A shown in FIG. 1A. Cross section A-A cuts parallel to axis 130 and across the gap between the bottom of proofmass 120 and frame 110. As may be seen in FIG. 1C, the channel 141 extends the full length of the wafer such that proofmass 121 is completely separate from proofmass 120 along the sides or proofmass 121. FIG. 1C illustrates hinge 103 and gauge 152. Hinge 103 and gauge 152 couple proofmass 121 to the frame 110. A similar coupling occurs between proofmass 121 and proofmass 120 on the opposite end of proofmass 121. As may also be seen in FIG. 1C, hinge 103 is preferably located above a centerline of the thickness of proofmass 120.

FIG. 1D illustrates a cross-sectional view of cross section B-B shown in FIG. 1A. Cross section B-B cuts parallel to axis 130 and across the channel 142 between the end of proofmass 122 and proofmass 120. As may be seen in FIG. 1D, the channel 142 extends the full length of the wafer along the sides of proofmass 122. Accordingly, proofmass 122 is completely separate from proofmass 120 and frame 110 other than the connection through the hinges 105 and 107 and the gauges 153 and 154.

FIG. 1E illustrates a cross-sectional view C-C from FIG. 1A. Cross section C-C cuts along axis 130. As may be seen in FIG. 1E, in a preferred embodiment, the frame 110 and the proofmass 120 are connected and technically formed from a single piece along flexures 131 and 132. In a preferred embodiment, flexures 131 and 132 do not extend all the way from the top surface 119 to the bottom surface 117. Instead, in a preferred embodiment, the flexures 131 and 132 extend from the top surface 119 to a depth equal to or approximately equal to the lower surface of the hinges 101, 103, 105 and 107 (Not shown in FIG. 1E). In various different embodiments, the thickness of flexures 131 and 132 may vary; however, preferably the flexures 131 and 132 are located between top surface 119 and the lower surface of the hinges 101, 103, 105 and 107.

Figure 2:
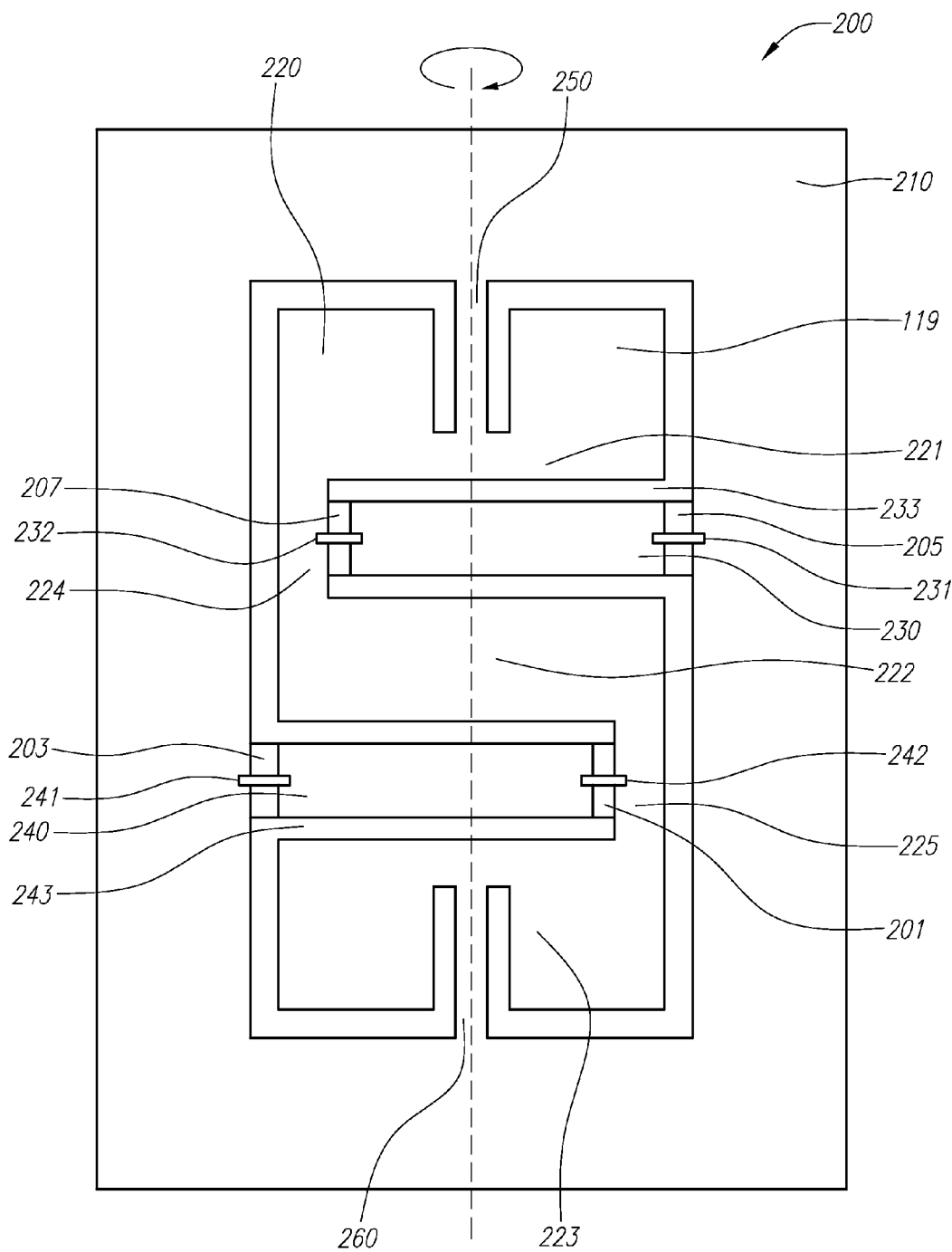
FIG. 2 illustrates a top view of one embodiment of a MEMS acceleration sensor.

The frame 110 in the embodiment shown in FIGS. 1A, 1B, 1C, and 1D, is in the shape of a square cuboid. However, other shapes may be used. For example, the frame 110 may be a cube, rectangular cuboid, circle, rhombus or be any other shape having any number of sides. FIG. 2 illustrates an embodiment of MEMS acceleration sensor 100 where the frame is in the shape of a rectangular cuboid. In a preferred embodiment, however, the frame 110 is a cuboid with a square cross-section.

In the embodiment shown in FIGS. 1A, 1B, 1C, and 1D, proofmass 120 is located at equal distances from the frame 110 on the left side, right side, top, and bottom. The proofmass 120 is offset from the frame 110 or separated from the frame 110 by gap 102. In a preferred embodiment, gap 102 is formed my etching in a similar manner to channels 141 and 144. However, in other embodiments, proofmass 120 may not be equally spaced from the frame 110 on the left side, right side, top, and bottom. For example, proofmass 120 may be a shorter distance from the frame 110 at the top than it is from the bottom. In such cases, proofmass 120 may be located off-center.

FIG. 2 illustrates a view of the top surface 119 of another embodiment of a MEMS acceleration sensor 200. The embodiment shown in FIG. 2 is similar to the embodiment shown in FIG. 1 except for the fact that embodiment has been rotated in the view 90 degrees counter-clockwise and the shape of the acceleration sensor 200 is generally rectangular instead of square. However, in order to clarify the embodiments disclosed herein, the description of the embodiment shown in FIG. 2 will incorporate alternative language for some of the elements compared to the description of the embodiment shown in FIG. 1.

The instant embodiment of MEMS acceleration sensor 200 shown in FIG. 2 includes frame 210; S-shaped proofmass 220; rectangular cuboid proofmasses 230 and 240; flexures 250 and 260; hinges 201, 203, 205 and 207, gauges 231, 232, 241, and 242; and channels 233 and 243. S-shaped proofmass 220 is located within the frame 210 and includes a top horizontal piece 221, center horizontal piece 222, bottom horizontal piece 223, left side piece 224 that connects top horizontal piece 221 to center horizontal piece 222, and right side piece 225 that connects center horizontal piece 222 to bottom horizontal piece 223. Flexure 250 couples the top horizontal piece 221 to the frame 210, and flexure 260 couples the bottom horizontal piece 223 to the frame 210.

S-shaped proofmass 220 includes a channel 233 between the top horizontal piece 221 and center horizontal piece 222. Channel 233 extends from the frame 210 to the left side piece 224. S-shaped proofmass 220 also includes a channel 243 between the center horizontal piece 222 and lower horizontal piece 223. Channel 243 extends from the frame 210 to the right side piece 225.

Rectangular cuboid proofmass 230 is located within channel 233, coupled to left side piece 224 of S-shaped proofmass 220 by hinge 207 and gauge 232, and coupled to the frame 210, at an opposite end of proofmass 230, by hinge 205 and gauge 231. Rectangular cuboid proofmass 240 is located within channel 243, coupled to the right side piece 225 of S-shaped proofmass 220 by hinge 201 and gauge 242, and coupled to the frame 210, at an opposite end of proofmass 240, by hinge 203 and gauge 241.

In operation, acceleration sensor 200 operates in a similar fashion to acceleration sensor 100 shown in FIGS. 1A-1E. In addition, acceleration sensor 200 has cross sections similar to those shown in FIGS. 1C-1E except with slightly different proportions.

Figure 3:
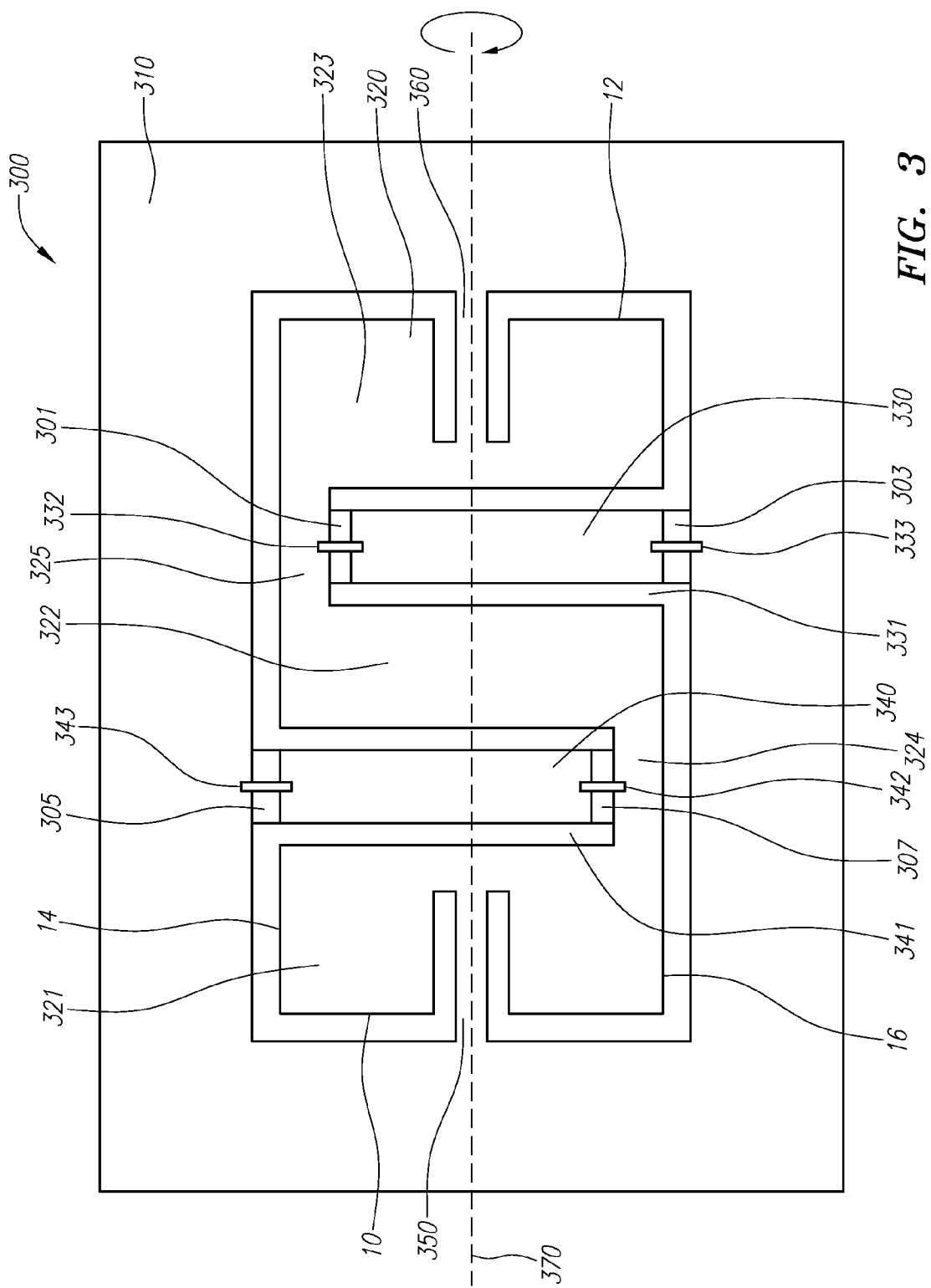
FIG. 3 illustrates a top view of one embodiment of a MEMS acceleration sensor.

FIG. 3 illustrates a view of the top surface 119 of the same embodiment of a MEMS acceleration sensor as shown in FIG. 2 except for it has been rotated back to the same orientation as the embodiment shown in FIG. 1, i.e. a 90 degrees clockwise rotation. However, for clarity of the description, the embodiment shown in FIG. 3 will be describe with some elements varying from the descriptions used in FIGS. 1 and 2. The instant embodiment of MEMS acceleration sensor 300 shown in FIG. 3 includes a frame 310; proofmasses 320, 330, and 340; flexures 350 and 360; vertical channels 331 and 341; hinges 301, 303, 305 and 307 and gauges 332, 333, 342, and 343. Proofmass 320 is located within the frame 310 and includes at least three vertical blocks 321, 322, and 323, and at least two horizontal blocks 324 and 325. The at least two horizontal blocks 324 and 325 couple alternate vertical blocks 321, 322, and 323 to form a single proofmass 320. In the embodiment illustrated in FIG. 3, horizontal block 324 couples vertical blocks 321 and 322, and horizontal block 325 couples vertical blocks 322 and 323.

In the instant embodiment, proofmass 320 has a left side 10, right side 12, top 14, and bottom 16. Flexure 350 couples the left side 10 of the proofmass 320 to the frame 310, and flexure 360 couples the right side 12 of the proofmass 320 to the frame 310. Flexures 350 and 360 define a pivot axis 370 for the proofmass 320 with respect to the frame 310. In the instant embodiment, vertical channel 331 extends from the bottom of the frame 310 and up into the proofmass 320, past the pivot axis 370 and between vertical blocks 322 and 323. Vertical channel 332 extends from the top of the frame 310 and down into the proofmass 320, past the pivot axis 370 and between vertical blocks 321 and 322.

Elongated proofmass 330 is located within vertical channel 331, coupled to the proofmass 320 by hinge 301 and gauge 332, and coupled to the frame 310 by hinge 303 and gauge 333. Elongated proofmass 340 is located within vertical channel 341, coupled to the proofmass 320 by hinge 307 and gauge 342, and coupled to the frame 310 by hinge 305 and gauge 343.

Figure 4:
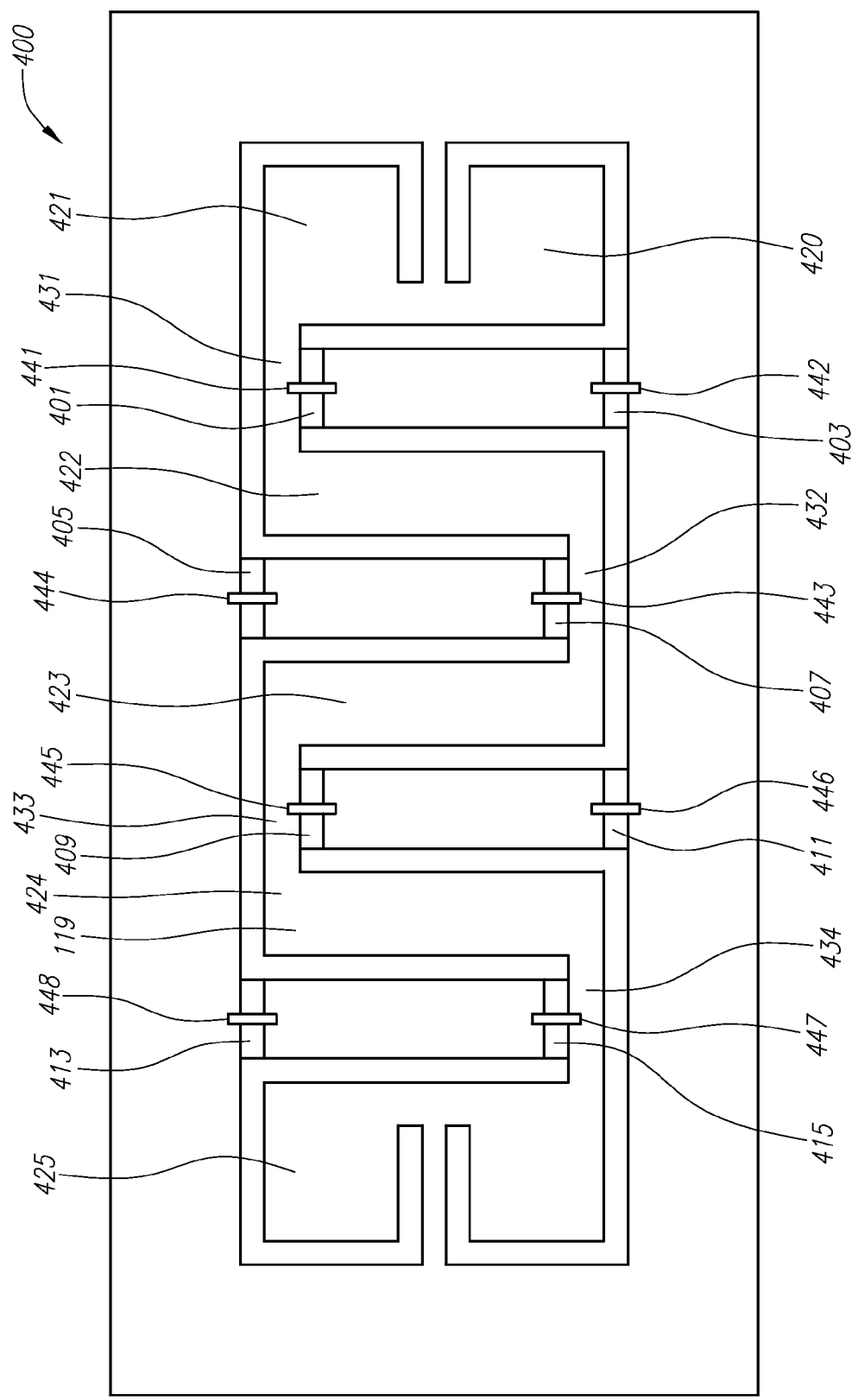
FIG. 4 illustrates a top view of one embodiment of a MEMS acceleration sensor that includes five vertical blocks, four horizontal blocks, and eight gauges.

In a preferred embodiment, proofmass 320 is S-shaped and includes only three vertical blocks and two horizontal blocks. In other embodiments, proofmass 320 may have other shapes. Although the embodiment shown in FIG. 3 shows three vertical blocks 321, 322, and 323, two horizontal blocks 324 and 325, four hinges 301, 303, 305 and 307, and four gauges 332, 333, 342, and 343, in other embodiments additional vertical blocks, horizontal blocks, hinges or gauges may be used. For example, FIG. 4 illustrates an embodiment of MEMS acceleration sensor 400 that includes five vertical blocks 421, 422, 423, 424, and 425; four horizontal blocks 431, 432, 433, 434; eight hinges 401, 403, 405, 407, 409, 411, 413 and 415, and eight gauges 441, 442, 443, 444, 445, 446, 447, and 448. In a preferred embodiment including more than the minimum number of gauges, gauges positioned the same distance from the center of the proofmass 420 may be averaged or used to produce a differential output to increase sensitivity and/or accuracy.

Although the embodiments shown in FIG. 1A through FIG. 3 are shown with 4 gauges each, other embodiments may use fewer gauges. For example, a half bridge may be created using only 2 gauges. Moreover, multiple parallel gauges may be used for redundancy. In addition, other electrical configurations may be used. Similarly, although the embodiment illustrated in FIG. 4 uses 8 gauges, the same embodiment may be used with only 4 gauges or 2 gauges or any number of gauges depending on the application.

Figure 5:
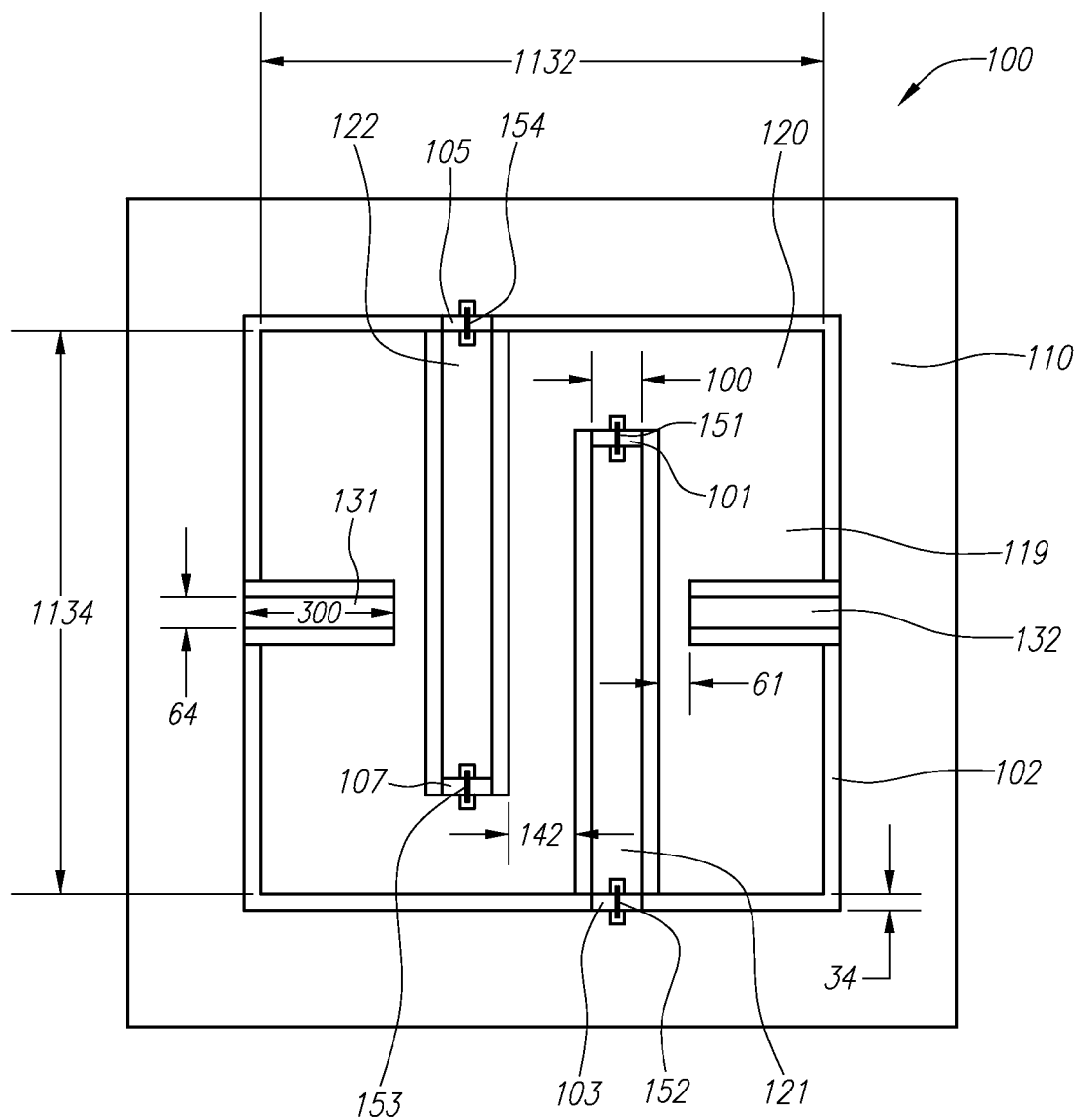
FIG. 5 illustrates a top view of one embodiment of a MEMS acceleration sensor with exemplary dimensions shown.

FIG. 5 illustrates one embodiment similar to that shown in FIG. 1 but with specific dimensions added. The dimensions in FIG. 5 are shown in micrometers. The dimensions are just shown for reference and any dimension may be changed without departing from the scope of the embodiments as claimed below.

Thus, the present patent document provides a high-output MEMS acceleration sensor that is sensitive to in-plane accelerations and yet insensitive to cross-axis accelerations.

Although the embodiments have been described with reference to preferred configurations and specific examples, it will readily be appreciated by those skilled in the art that many modifications and adaptations of the high-output MEMS accelerometer described herein are possible without departure from the spirit and scope of the embodiments as claimed hereinafter. Thus, it is to be clearly understood that this description is made only by way of example and not as a limitation on the scope of the embodiments as claimed below.

What is claimed is:
1. A MEMS acceleration sensor comprising:
a frame;
a first proofmass located within the frame, the first proofmass including a left side, a right side, a top, and a bottom;
an axis running from the left side to the right side at about a median point between the top and the bottom;
a first flexure running along the axis and coupling the left side to the frame;
a second flexure running along the axis and coupling the right side to the frame;

a first channel that extends from the bottom up past the axis to a first channel end;

a second channel that extends from the top down past the axis to a second channel end;

a second proofmass located within the first channel and coupled to the first proofmass via a first hinge and a first gauge at the first channel end and coupled to the frame at the bottom via a second hinge and a second gauge; and, a third proofmass located within the second channel and coupled to the first proofmass via a third hinge and a third gauge at the second channel end and coupled to the frame at the top via a fourth hinge and a fourth gauge.

2. The MEMS acceleration sensor of claim 1, wherein the first proofmass rotates relative to the frame about the axis.

3. The MEMS acceleration sensor of claim 2, wherein the first gauge, the second gauge, the third gauge, and the fourth gauge are made of a piezoresistive material.

4. The MEMS acceleration sensor of claim 3, wherein rotation of the first proofmass about the axis causes a piezoresistive effect in at least one of the first gauge, the second gauge, the third gauge, and the fourth gauge.

5. The MEMS acceleration sensor of claim 1, wherein the second proofmass and the third proofmass are rectangular cuboids.

6. The MEMS acceleration sensor of claim 1, wherein the frame is a stationary rim.

7. The MEMS acceleration sensor of claim 6, wherein the frame has a length of 1.6 millimeters or less and a width of 1.6 millimeters or less.

8. The MEMS acceleration sensor of claim 1, wherein all the hinges are located above a centerline of a thickness of the first proofmass.

9. A MEMS acceleration sensor comprising:

a frame;

an S-shaped proofmass located within the frame; wherein the S-shaped proofmass includes a top horizontal piece, a center horizontal piece, a bottom horizontal piece, a left side piece that connects the top horizontal piece to the center horizontal piece, and a right side piece that connects the center horizontal piece to the bottom horizontal piece; wherein the S-shaped proofmass forms a first channel that exists between the top horizontal piece and the center horizontal piece and extends from the frame to the left side piece; and wherein the S-shaped proofmass forms a second channel that exists between the center horizontal piece and the bottom horizontal piece and extends from the frame to the right side piece;

a first flexure coupling the top horizontal piece to the frame;

a second flexure coupling the bottom horizontal piece to the frame;

a first rectangular cuboid proofmass located within the first channel and coupled to the left side piece of the S-shaped proofmass via a first hinge and a first gauge and coupled to the frame via a second hinge and a second gauge at an opposite end of the first rectangular cuboid proofmass from the first hinge; and a second rectangular cuboid proofmass located within the second channel and coupled to the right side piece of the S-shaped proofmass via a third hinge and a third gauge and coupled to the frame via a fourth hinge and a fourth gauge at an opposite end of the second rectangular cuboid proofmass from the third hinge.

10. The MEMS acceleration sensor of claim 9, wherein the S-shaped proofmass rotates relative to the frame about an axis running from a top side of the frame to a bottom side of the frame at about a median point between a left side of the frame and a right side of the frame.

11. The MEMS acceleration sensor of claim 10, wherein the first gauge, the second gauge, the third gauge, and the fourth gauge are made of a piezoresistive material.

12. The MEMS acceleration sensor of claim 11, wherein rotation of the S-shaped proofmass about the axis causes a piezoresistive effect in at least one of the first gauge, the second gauge, the third gauge, and the fourth gauge.

13. The MEMS acceleration sensor of claim 9, wherein the frame is a stationary rim.

14. The MEMS acceleration sensor of claim 9, wherein the four hinges are located above a centerline of a thickness of the S-shaped proofmass.

15. A MEMS acceleration sensor comprising:

a frame;

a proofmass located within the frame, the proofmass including at least three vertical blocks and at least two horizontal blocks coupling alternate vertical blocks to form a single proofmass, wherein the proofmass has a left side, a right side, a top, and a bottom;

a first flexure coupling the left side of the proofmass to the frame;

a second flexure coupling the right side of the proofmass to the frame, wherein the first flexure and the second flexure define a pivot axis for the proofmass with respect to the frame;

a first vertical channel that extends from a bottom of the frame up into the proofmass past the pivot axis between two vertical blocks to a first of the at least two horizontal blocks;

a second vertical channel that extends from a top of the frame down into the proofmass past the pivot axis between two vertical blocks to a second of the at least two horizontal blocks;

a first elongated proofmass located within the first vertical channel and coupled to the proofmass via a first hinge and coupled to the frame via a second hinge;

a second elongated proofmass located within the second vertical channel and coupled to the proofmass via a third hinge and coupled to the frame via a fourth hinge; and at least two gauges wherein the two gauges are located above any two of the four hinges and each gauge is coupled to the same elements as the respective hinge each gauge is located above.

16. The MEMS acceleration sensor of claim 15, wherein the at least two gauges, are made of a piezoresistive material.

17. The MEMS acceleration sensor of claim 16, wherein rotation of the proofmass about the pivot axis causes a piezoresistive effect in at least one of the at least two gauges.

18. The MEMS acceleration sensor of claim 15, wherein the first elongated proofmass and the second elongated proofmass are rectangular cuboids.

19. The MEMS acceleration sensor of claim 15, further comprising four gauges wherein each of the four gauges is located above one of the four hinges and is coupled to the same elements as the respective hinge each gauge is located above.

20. The MEMS acceleration sensor of claim 15, wherein the four hinges are located above a centerline of a thickness of the proofmass.

* * * * *